(12) United States Patent
Kasorla et al.

(10) Patent No.: US 9,368,214 B2
(45) Date of Patent: Jun. 14, 2016

(54) PROGRAMMABLE PEAK-CURRENT CONTROL IN NON-VOLATILE MEMORY DEVICES

(71) Applicant: Apple Inc., Cupertino, CA (US)

(72) Inventors: Yoav Kasorla, Kfar Netar (IL); Avraham Poza Meir, Rishon Le-Zion (IL)

(73) Assignee: Apple Inc., Cupertino, CA (US)

( * ) Notice: Subject to any disclaimer, the term of this patent is extended or adjusted under 35 U.S.C. 154(b) by 1 day.

(21) Appl. No.: 14/322,102

(22) Filed: Jul. 2, 2014

(65) Prior Publication Data

US 2015/0098272 A1    Apr. 9, 2015

Related U.S. Application Data

(60) Provisional application No. 61/886,281, filed on Oct. 3, 2013.

(51) Int. Cl.
| | |
|---|---|
| *G11C 11/34* | (2006.01) |
| *G11C 16/10* | (2006.01) |
| *G11C 16/04* | (2006.01) |
| *G11C 16/34* | (2006.01) |

(52) U.S. Cl.
CPC ............ *G11C 16/10* (2013.01); *G11C 16/0483* (2013.01); *G11C 16/3422* (2013.01)

(58) Field of Classification Search
CPC ....... G06F 1/26; G06F 1/3234; G06F 1/3225; G06F 1/3296; G06F 1/32; G06F 1/30; G06F 1/3275; G06F 1/3293; G06F 2206/1014; G06F 3/0625; G06F 3/0679; G06F 1/3237; G06F 1/324; G06F 1/325; G06F 1/3268; G06F 1/3287; G06F 3/0688; G11C 11/40622; G11C 5/14; G11C 16/30
USPC .......... 365/227, 185.24, 185.33, 129, 185.11, 365/226, 229, 228, 244
See application file for complete search history.

(56) References Cited

U.S. PATENT DOCUMENTS

| | | | |
|---|---|---|---|
| 6,442,698 B2 | 8/2002 | Nizar | |
| 8,583,947 B2 | 11/2013 | Byom et al. | |
| 8,854,885 B2 | 10/2014 | Nguyen | |
| 2011/0280082 A1* | 11/2011 | Ruby .................. | G11C 11/5628 365/185.19 |
| 2012/0331282 A1* | 12/2012 | Yurzola ................. | G06F 1/3275 713/100 |
| 2013/0301372 A1 | 11/2013 | Park et al. | |
| 2014/0029357 A1 | 1/2014 | Lee et al. | |
| 2014/0112079 A1 | 4/2014 | Wakrat et al. | |
| 2014/0237167 A1 | 8/2014 | Yurzola et al. | |
| 2015/0003162 A1* | 1/2015 | Mui ................... | G11C 11/5635 365/185.17 |

* cited by examiner

*Primary Examiner* — Fernando Hidalgo
(74) *Attorney, Agent, or Firm* — Meyertons, Hood, Kivlin, Kowert & Goetzel, P.C.

(57) ABSTRACT

A method includes, in a memory device, receiving a command that specifies a peak power consumption that is not to be exceeded by the memory device. A memory of the memory device is configured in accordance with the peak power consumption specified in the command. A data storage operation in the configured memory is performed, while complying with the specified peak power consumption.

20 Claims, 4 Drawing Sheets

PROGRAMMABLE PEAK-CURRENT CONTROL IN NON-VOLATILE MEMORY DEVICES

CROSS-REFERENCE TO RELATED APPLICATIONS

This application claims the benefit of U.S. Provisional Patent Application 61/886,281, filed Oct. 3, 2013, whose disclosure is incorporated herein by reference.

FIELD OF THE INVENTION

The present invention relates generally to memory devices, and particularly to methods and systems for controlling peak current consumption in memory devices.

SUMMARY OF THE INVENTION

An embodiment of the present invention provides a method including, in a memory device, receiving a command that specifies a peak power consumption that is not to be exceeded by the memory device. A memory of the memory device is configured in accordance with the peak power consumption specified in the command. A data storage operation in the configured memory is performed, while complying with the specified peak power consumption.

In some embodiments, the memory includes multiple memory cells, and configuring the memory includes dividing the memory cells into two or more subsets depending on the specified peak power consumption, and performing the data storage operation includes applying the data storage operation to the subsets at respective different times. In other embodiments, dividing the memory cells into the subsets includes setting a number of the subset or a size of each subset based on the specified peak power consumption.

In some embodiments, the data storage operation includes a read command, and dividing the memory cells into the subsets includes defining each subset to include the memory cells associated with a respective group of bit lines of the memory. In other embodiments, the data storage operation includes a write command to the memory cells associated with a given word line of the memory, and dividing the memory cells into the subsets includes defining each subset to include the memory cells associated with a respective sub-portion of the word line.

In some embodiments, the data storage operation includes an erasure command of a given block of the memory, and dividing the memory cells into the subsets includes defining each subset to include the memory cells associated with a respective group of word lines in the given block. In other embodiments, dividing the memory cells into the subsets includes setting a delay between the different times based on the specified peak power consumption. In other embodiments, the method includes alternating an order in which the data storage operation is applied to the subsets.

In some embodiments, the memory includes multiple memory cells arranged in strings that further include respective current sources, and configuring the memory includes controlling currents produced by the current sources based on the specified peak power consumption. In other embodiments, the memory includes multiple memory cells that are programmed using an iterative programming and verification (P&V) process, and configuring the memory includes adapting one or more parameters of the P&V process based on the specified peak power consumption. Adapting the parameters of the P&V process may include iteratively increasing a verification threshold of the P&V process, without inhibiting the memory cells whose stored values have exceeded the verification threshold from receiving subsequent programming pulses.

There is also provided, in accordance with an embodiment of the present invention, an apparatus including a memory and circuitry. The circuitry is configured to receive a command that specifies a peak power consumption that is not to be exceeded by the memory device, to configure the memory in accordance with the peak power consumption specified in the command, and to perform a data storage operation in the configured memory, while complying with the specified peak power consumption.

There is also provided, in accordance with an embodiment of the present invention, an apparatus including an interface and a processor. The interface is configured to communicate with a memory device including a memory. The processor is configured to send to the memory device a command that specifies a peak power consumption that is not to be exceeded by the memory device, so as to cause the memory device to configure the memory in accordance with the peak power consumption specified in the command, and to perform a data storage operation in the configured memory, while complying with the specified peak power consumption.

There is additionally provided, in accordance with an embodiment of the present invention, a method including writing storage values to multiple memory cells by applying programming pulses in a programming and verification (P&V) process. During the P&V process, a verification threshold used for verifying the storage values is iteratively increased, without inhibiting the memory cells whose storage values have exceeded the verification threshold from receiving subsequent programming pulses.

There is further provided, in accordance with an embodiment of the present invention, an apparatus including a memory and circuitry. The circuitry is configured to write storage values to multiple memory cells of the memory by applying programming pulses in a programming and verification (P&V) process, and, during the P&V process, to iteratively increase a verification threshold used for verifying the storage values, without inhibiting the memory cells whose storage values have exceeded the verification threshold from receiving subsequent programming pulses.

The present invention will be more fully understood from the following detailed description of the embodiments thereof, taken together with the drawings in which:

DETAILED DESCRIPTION OF EMBODIMENTS

Overview

Peak current consumption is an important figure-of-merit and a major consideration in the design of memory devices.

The peak current consumption of a memory device has an impact, for example, on power supply design as well as on inter-operability between different vendors and device generations.

A typical Flash device comprises a large array of analog memory cells having rows associated with word lines and columns associated with bit lines. Execution of a storage command, such as a page read command, page write command or block erase command, typically involves a sequence of internal operations in the memory device. Some of these internal operations, such as charging and discharging of bit lines or iterative programming and verification, incur high peak current.

Embodiments of the present invention that are described herein provide improved methods and systems for reducing the peak current consumption of a memory device. In the disclosed embodiments, the peak current consumption of a memory device is programmable, e.g., using commands from a memory controller or host. Using this programmability feature, it is possible for a user to configure the memory device for different trade-offs between peak current consumption and other performance measures such as latency or throughput.

Several example implementations of memory devices with configurable peak current consumption are described herein. Setting and adaptation of the peak current consumption can be performed at any desired time, e.g., during production, at power-up or during normal operation. Typically, the disclosed techniques maintain the functionality of conventional storage commands, while at the same time permitting flexible control over the peak current consumption of the memory device.

System Description

Figure 1:
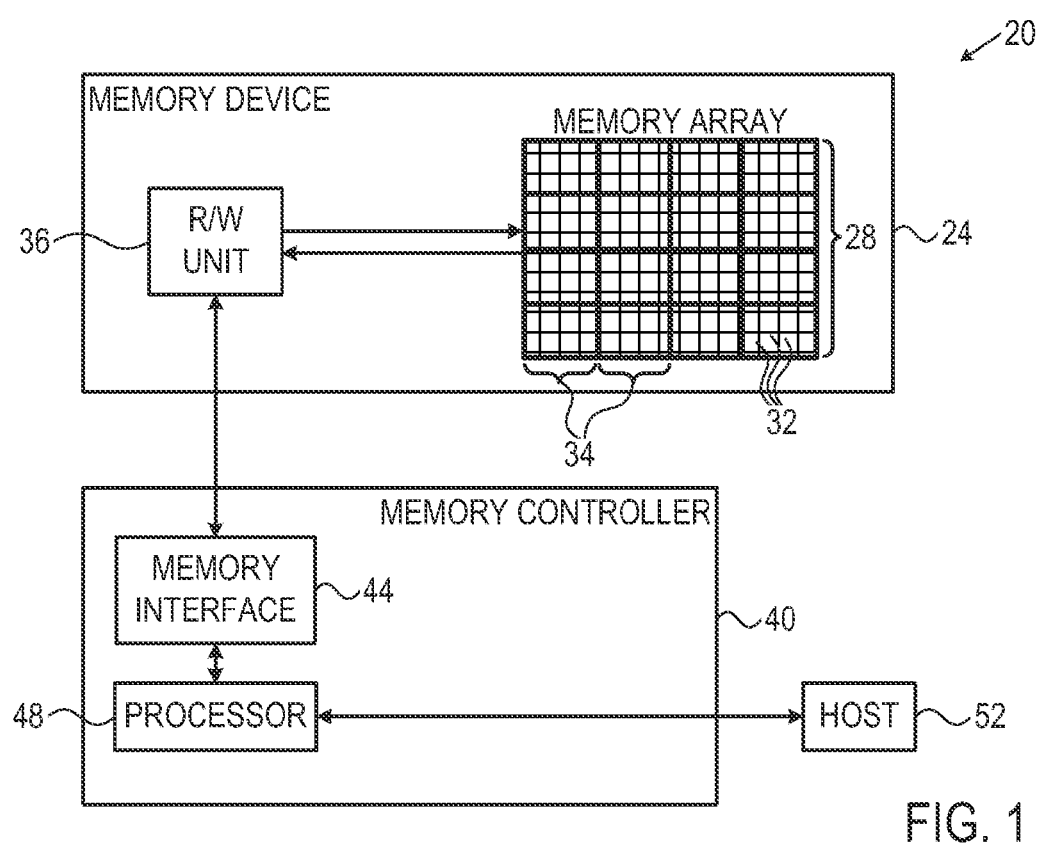
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("USB Flash Drives," memory cards or similar devices), Solid State Disks (SSD), digital cameras, music and other media players and/or any other system or device in which data is stored and retrieved.

System 20 comprises a memory device 24, which stores data in a memory, e.g., a memory cell array 28. The memory array comprises multiple memory blocks 34. Each memory block 34 comprises multiple analog memory cells 32. In the context of the present patent application, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a storage element, such as a floating-gate transistor. In the case where each storage cell comprises a metal-oxide semiconductor (MOS) transistor, the gates of the transistors in each row are connected by word lines, and the sources of the transistors in each column are connected by bit lines. In some cases, the bit lines traverse other elements, as well as other storage elements, such as NAND flash memory. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In some embodiments, the memory cells are arranged in a three-dimensional (3-D) configuration.

Typically, memory controller 40 programs data in page units, but erases entire memory blocks 34. Typically although not necessarily, a memory block is on the order of $10^6$ memory cells, whereas a page is on the order of $10^3$-$10^4$ memory cells. In some embodiments, a given memory die comprises multiple memory arrays that are referred to as planes, and it is possible to program multiple pages into multiple respective planes in parallel.

Programmable Setting of Peak Current Consumption in Memory Devices

In some embodiments of the present invention, memory controller 40 sends to memory device 24 a command that specifies a peak power consumption that is not to be exceeded by the memory device. The interface between memory controller 40 and memory device 24 supports one or more such commands for setting the peak current consumption of the memory device. Typically, the commands enable the memory controller to set various operating points, e.g., different trade-offs between peak current consumption and read/write latency and throughput. Configuring the peak power consumption can be performed through the same interface used for exchanging storage commands, through side-band signaling, or through the use of dedicated signals or non-volatile memory cells in the memory device.

Some of the embodiments taught herein group the memory cells along the word lines and/or bit lines into subsets (e.g., the memory cells attached to the word lines and/or bit lines). R/W unit 36 may activate all of subsets simultaneously and perform storage operations with low latency but higher peak currents. Conversely, memory controller 40 may send a command to reduce peak current consumption. In this case, R/W unit 36 may activate, or enable, a portion of the subsets and perform the storage operations on the enabled portions so as to reduce peak current consumption at the expense of latency.

In other embodiments, programmable current sources can be implemented in the memory device, such as in NAND strings, so as to control peak current consumption during the storage operations. In yet other embodiments, the R/W unit modifies program and verify (P&V) parameters such that blind programming pulses (programming pulses without a subsequent verification step) are used in an initial programming cycle, in conjunction with a lower read threshold voltage that is increased in subsequent P&V iterations so as to maintain a lower peak current consumption.

Programmable Setting of Peak Current Consumption Using Staggered Activation of Memory Cell Subsets As explained above, each memory block 34 comprises multiple word lines and multiple bit lines. Typically, R/W unit 36 executes a page read command by selecting a certain word line, charging the bit lines, allowing the bit lines to discharge, and sensing the bit-line currents or voltages. This sequence of operations exhibits high current peaks caused by simultaneous charging and discharging of the bit lines.

In some embodiments, R/W unit 36 divides the bit lines into two or more subsets, e.g., two, four or eight subsets. When executing a page read command, the R/W unit charges and/or discharges the bit lines subset by subset, with a certain time delay between subsets. Such a scheme reduces the number of bit lines that are charged or discharged simultaneously, and thus reduces the peak current consumption. The reduction in peak current, however, comes at the expense of readout latency and throughput, which deteriorate with the number of subsets and with the delay between subsets.

In one embodiment, the number of subsets (or equivalently the number of bit lines per subset) is configurable via a command from memory controller 40. Thus, for example, the memory controller may instruct R/W unit 36 to charge and/or discharge all bit lines simultaneously. This trade-off reduces readout latency but incurs high peak current. To set a different trade-off, the memory controller may instruct R/W unit 36 to divide the bit lines into the maximal possible number of subsets (e.g., eight subsets) and to stagger bit-line charging/discharging among the subsets. Such a command reduces the peak current considerably, but on the other hand increases the readout latency and reduces throughput. Intermediate operating points (e.g., staggering of two or four subsets of bit lines) may also be configurable.

In other embodiments, R/W unit 36 divides each word line into two or more subsets, e.g., two, four or eight subsets. When executing a page write command, the R/W unit programs the memory cells of each subset at a time, with a certain time delay between subsets. Such a scheme reduces the peak current consumption, at the expense of programming speed. The peak current consumption during block erasure commands can be reduced in a similar manner, e.g., by erasing partial subsets of the word lines one at a time.

Generally, R/W unit 36 may divide the memory cells into subsets, wherein the number of subsets is specified in a command received from memory controller 40. Execution of a data storage operation (e.g., read, write or erase) is performed subset by subset, with a certain delay between subsets. The delay between subsets may also be programmable, e.g., specified in the same command or in another command from the memory controller.

Figure 2:
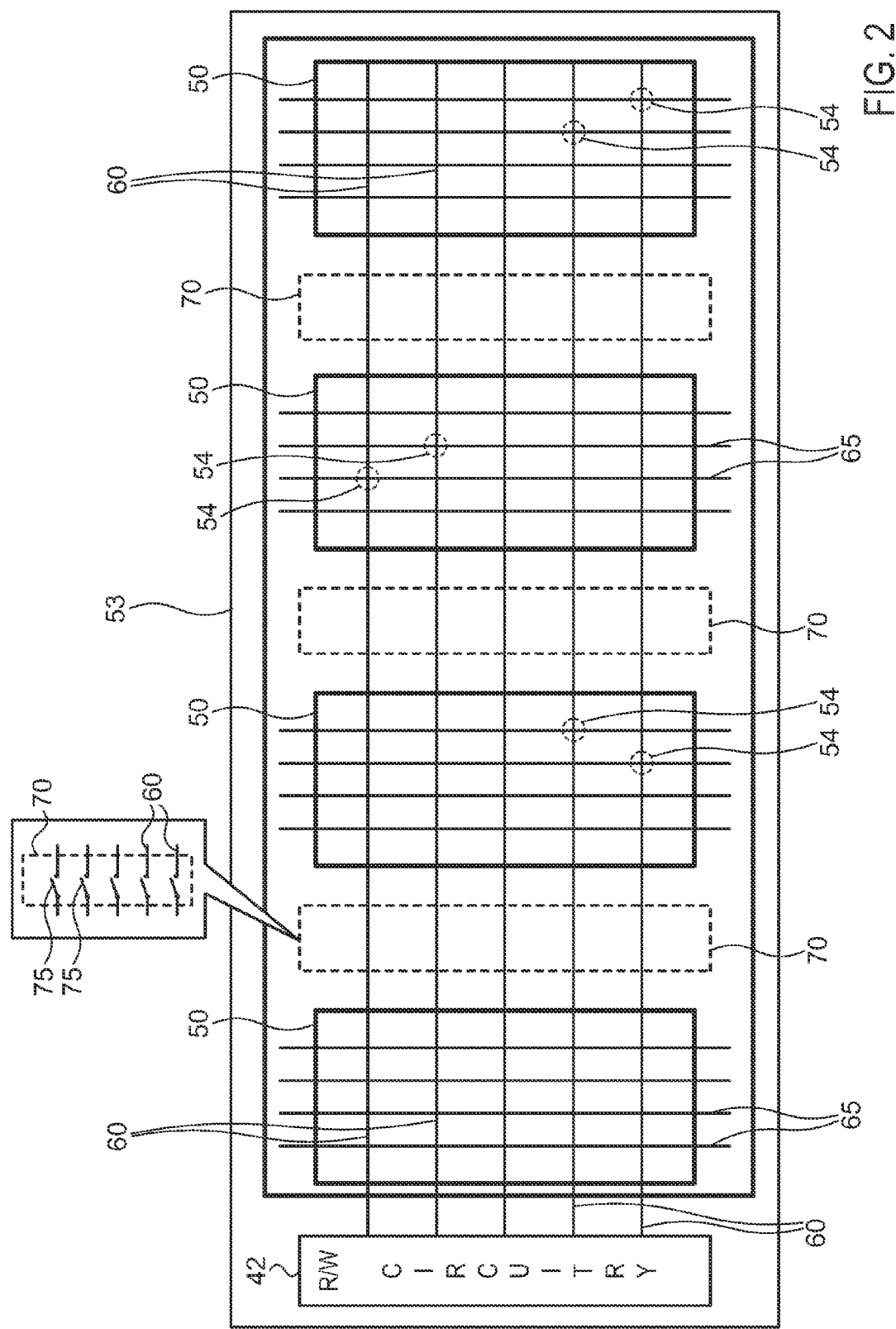
FIG. 2 is a block diagram that schematically illustrates a multi-plane Flash die, in accordance with an embodiment of the present invention.

FIG. 2 is a block diagram that schematically illustrates a multi-plane Flash die 53, in accordance with an embodiment of the present invention. Die 53 comprises multiple memory planes 50, each comprising an array of memory cells 54. The memory cells are associated with word lines 60 and bit lines 65. A R/W unit 42 performs storage operations, e.g., read, write and erase, in the various planes of die 53.

In some embodiments, planes 50 or groups of planes serve as subsets for staggered storage operations. In other words, R/W unit 42 may perform a read, write or erase operation in a staggered manner, plane-by-plane or a group of planes at a time. In the four-plane example of FIG. 2, R/W unit 42 may group all four planes together, divide the planes into two subsets with two planes in each subset, or divide the planes into four subsets with one plane in each subset. These three settings differ in peak current consumption, as well as in latency and throughput.

The above-described staggered activation of planes can be used to reduce the peak current in read commands (e.g., by staggering the bit-line charging and discharging between planes or plane groups), or in write or erase commands (e.g., by dividing the word-lines into subsets according to planes or plane groups).

In other embodiments, die 53 comprises word-line switching circuits 70 disposed between the planes. Switching circuits 70 comprises switches 75 that are controlled by R/W unit 42. By toggling switches 75, R/W unit 42 is able to cut-off portions of word lines at the plane boundaries. Using this mechanism, it is possible to program or erase only individual planes or plane groups, instead of programming the entire word line across all four planes. As a result, peak current is reduced at the expense of latency.

In some embodiments, R/W unit (36 or 42) alternates the activation order of the various subsets. For example, the R/W unit may vary the activation order of the subsets from one command to the next. This sort of alternation helps to distribute read disturb and other impairments evenly among the sections.

Figure 3:
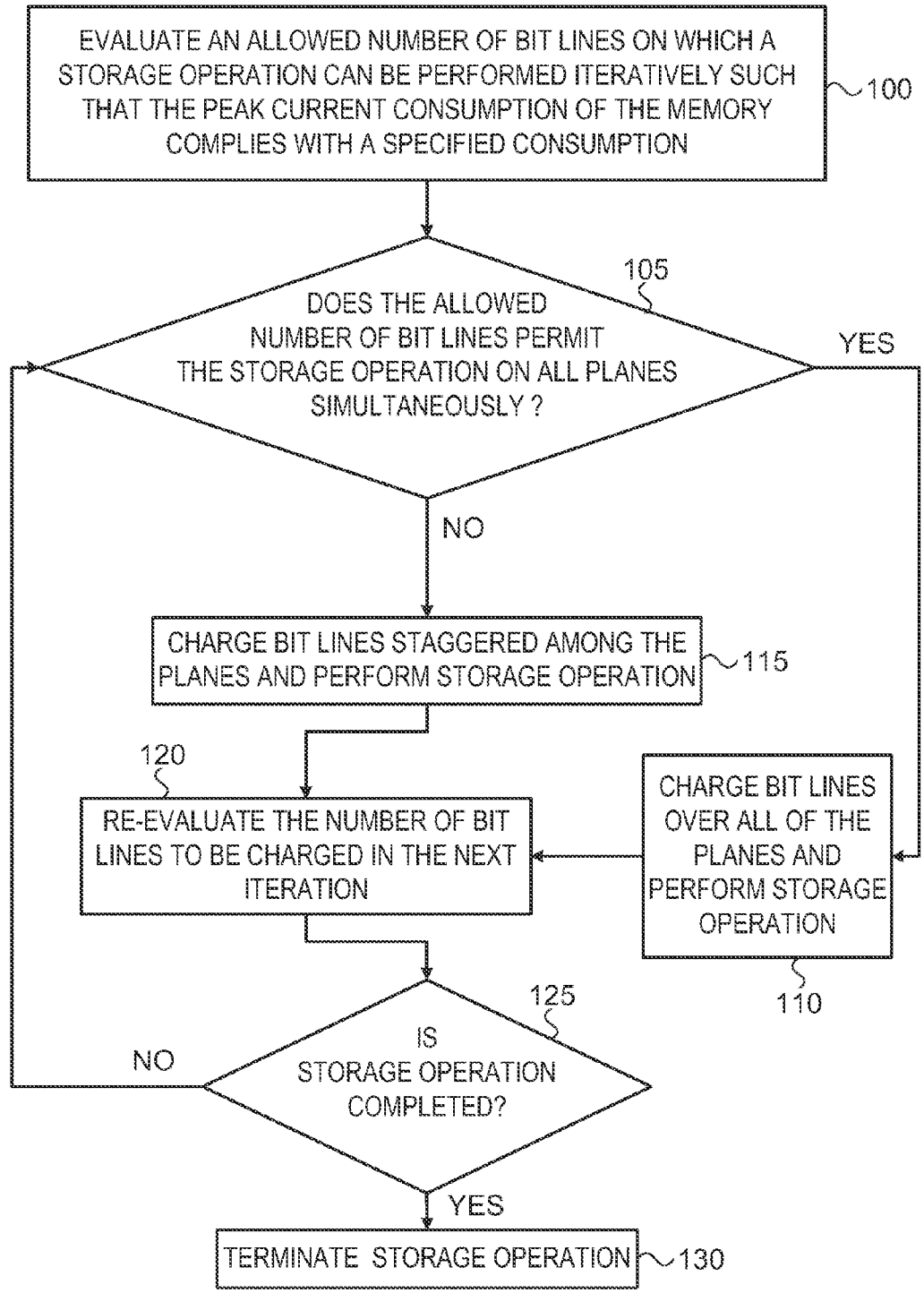
FIG. 3 is a flow chart that schematically illustrates a method of staggered bit line programming in a memory die, in accordance with an embodiment of the present invention.

FIG. 3 is a flow chart that schematically illustrates a method of staggered bit line programming in memory die 53, in accordance with an embodiment of the present invention. In an evaluation step 100, R/W circuitry 42 evaluates an allowed number of bit lines that can be programmed in each iteration, such that the peak current consumption in the memory complies with the peak current consumption specified by host 52 and/or controller 40.

In a first decision step 105, R/W circuitry 42 evaluates whether the number of bit lines to be charged permits programming all of the planes simultaneously based on the allowed number of bit lines. If so, in a first charging step 110, bit lines over all of the planes are charged and the enabled memory cells programmed. If not, in a second charging step 115, bit lines are charged staggered among the planes and the enabled memory cells are programmed staggering among the memory planes.

In a reevaluating step 120, the number of bit lines to be charged in the next iteration is re-evaluated. In a second decision step 125, R/W circuitry assesses whether the programming is completed. If so, programming is terminated in a terminating step 130. If not, programming continues with decision step 105.

Programmable Setting of Peak Current Consumption Using Programmable Current Sources in NAND Chains In some embodiments, the memory device comprises a NAND Flash device in which the memory cells are arranged in NAND strings. The NAND strings are also sometimes referred to as chains.

In an embodiment, each NAND chain comprises a programmable current source that is controlled by the R/W unit. By controlling the current sources, the R/W unit is able to individually control the current flowing through each chain. In an example implementation, the source-select and/or drain-select transistor of a NAND chain can be used as programmable current sources, e.g., by controlling their gate voltage using the appropriate source-select and/or drain-select lines. Additionally or alternatively, the memory array may comprise a dummy word line whose memory cells serve as programmable current sources by controlling their gate voltages. Alternatively, the programmable current sources can be implemented in any other suitable manner. These techniques control the slew rate of the current, at the possible expense of longer sense time.

Setting of Peak Current Consumption Using Programmable P&V Parameters

The R/W unit, or circuitry, typically programs a group of memory cells using an adaptive Programming & Verification (P&V) process. In such a process, the R/W unit applies a sequence of programming pulses to a selected word line. The pulses typically increase in energy (e.g., voltage) by a certain increment from one pulse to the next. After one or several programming iterations, the cell threshold voltages are verified. Subsequent pulses are applied only to the memory cells that have not yet reached their intended threshold voltages. Memory cells that have reached their intended threshold voltages are inhibited from receiving subsequent pulses.

As can be seen from the above description, the number of memory cells that actually receive programming pulses decreases as the iterations progress. Since the current consumption depends on the number of memory cells being programmed, the peak current consumption is relatively high in the initial P&V iterations, and lower in the last P&V iterations.

In some embodiments, the R/W unit uses different P&V parameters in different P&V iterations, in order to reduce peak current consumption. Typically, the R/W unit uses certain P&V parameters in the (one or more) initial iterations, and different parameters in the (one or more) last iterations. In an example embodiment, the R/W unit carries out the following P&V process (assuming that the major current peak occurs during bit-line discharge, and that the target programming voltage is 1V):

1. Apply to the selected word line several blind programming pulses, i.e., programming pulses that are not followed by sense and verification.
2. Sense the bit lines at an expected good operating point, e.g., a read threshold voltage for which it is expected that at least 50% of the memory cells passed the threshold (for example −0.5V). If the number of memory cells that passed the read threshold is larger than 50%, apply an additional programming pulse and sense the bit lines at a read threshold level of 0.2V higher than the previous level. Note that when 50% of the memory cells are above the read threshold, the current is 50% of the maximum peak current.
3. Repeat step (2) above until reaching the target read threshold voltage of 1V.

There is a unique feature demonstrated in this embodiment during the P&V process for reducing the peak current consumption. After the application of one or more blind programming pulses to the selected bit lines, the R/W unit iteratively increases the verification threshold voltage applied to the selected word line, so as to keep the bit line sensing currents at lower levels (e.g., below the peak current consumption) until the target verification threshold voltage is reached.

In additional and possibly separate embodiments, the R/W unit can be configured to dynamically increase the verification threshold after counting the number of memory cells that passed the verification threshold (possibly with low accuracy) without inhibiting those cells from receiving subsequent programming pulses.

Figure 4:
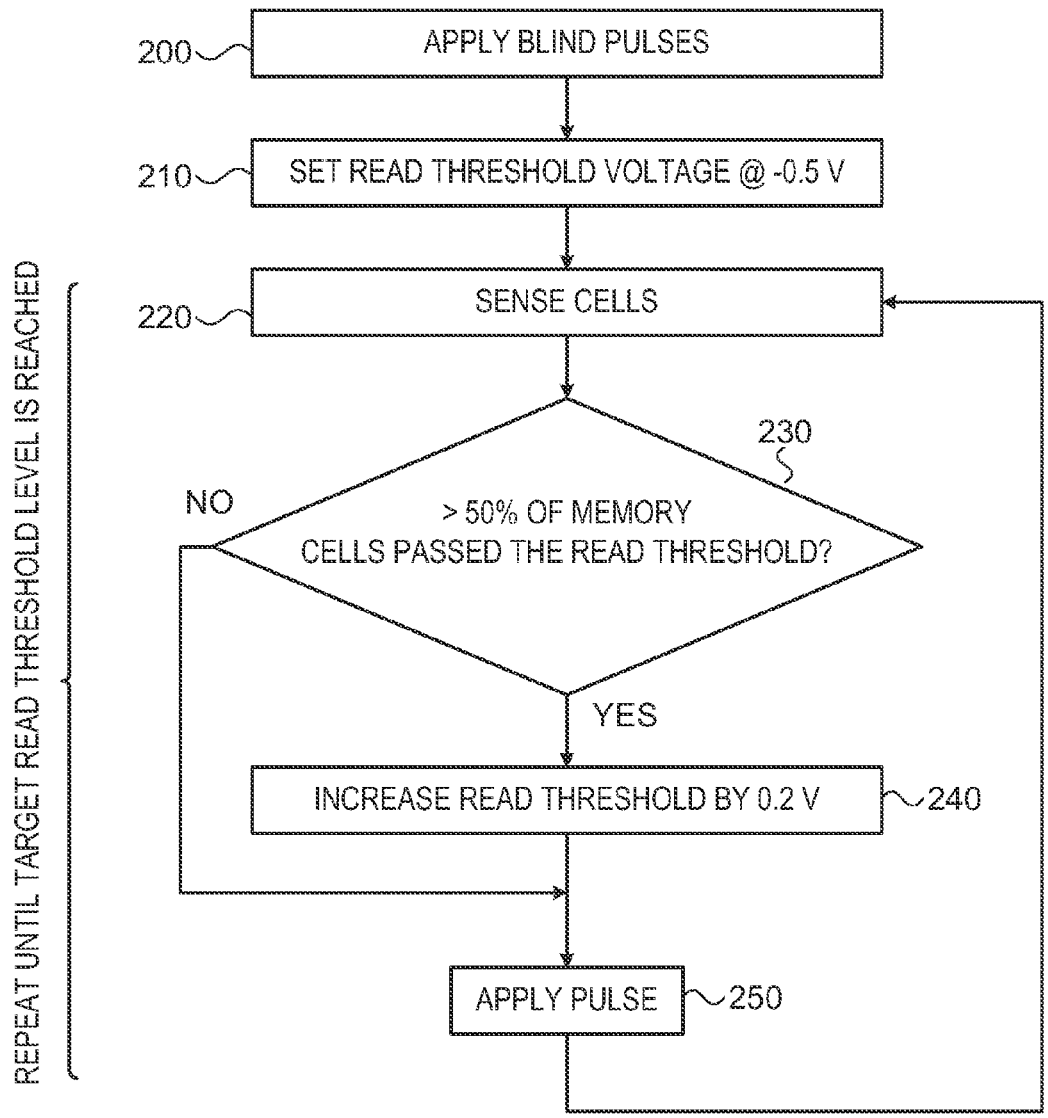
FIG. 4 is a flow chart that schematically illustrates a method of programming and verification in a memory device, in accordance with an embodiment of the present invention.

FIG. 4 is a flow chart that schematically illustrates a method of program and verification in memory device 24, in accordance with an embodiment of the present invention. FIG. 4 further illustrates the P&V process described above. In an applying step 200, R/W unit 36 applies one or more blind programming pulses to a selected word line in memory 28. In a setting step 210, R/W unit 36 sets the read threshold voltage at −0.5 V. In a sensing step 220, R/W unit 36 senses the cells, e.g. assesses the storage value attained after the previous programming pulse step.

In a decision step 230, R/W unit 36 assesses if the storage value of 50% of the memory cells pass the read threshold voltage. If not, R/W unit 36 applies another pulse in an applying step 250. If so, in an increasing step 240, R/W unit 36 increases the read threshold voltage by 0.2 V and then R/W unit 36 applies another pulse in applying step 250. In either case based on decision step 230, R/W unit 36 applies another programming pulse. The storage values in memory cells in memory 28 after the pulse are then sensed in sensing step 220. This process continues until the target read threshold voltage is reached, typically 1 V.

The P&V method described in FIG. 4 is by way of example and not limitation of the embodiments of the present invention. Any suitable P&V metrics, such as the number of blind programming pulses, or the target read threshold voltage, may be used to control the peak current consumption. Alternatively, any other suitable P&V process and/or different numerical values can be used. The difference in P&V parameters is aimed at reducing peak current in the initial P&V iterations, in which peak current reduction is especially important. In the last iterations (which draw less current in the first place), optimization is more for programming accuracy.

The definition of "one or more initial iterations" and "one or more last iterations" may be predefined, i.e., a pre-assigned number of iterations. In other embodiments, the R/W unit senses the actual peak current and defines the "one or more initial iterations" and "one or more last iterations" depending on the sensed peak current. In yet another embodiment, the R/W unit defines the "one or more initial iterations" and "one or more last iterations" depending on the absolute or relative number of memory cells being programmed at each iteration.

In another embodiment, when applying P&V in a staggered manner between memory subsets (e.g., planes), the R/W unit may use a certain delay between subsets during the initial iterations, and a smaller delay in the last iterations. In yet another embodiment, when using programmable current sources in the NAND chains, the R/W unit may set a first current level during the initial iterations, and a higher second current level in the last iterations. Further alternatively, the R/W unit may modify any other suitable parameter related to the P&V process in order to reduce peak current while minimizing the degradation in other performance figures.

In the embodiments described herein, the peak current consumption is set and adapted using commands from the memory controller or host. In alternative embodiments, however, the peak current consumption may be programmed using any other suitable means or interface, for example over a dedicated interface that is different from the memory controller or host interface, or set in the memory device using One-Time Programming (OTP) or strapping, for example.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
in a memory device, receiving a command that specifies a peak power consumption that is not to be exceeded by the memory device, wherein the memory device includes a memory having a plurality of memory blocks;
configuring the memory dependent upon the peak power consumption specified in the command;
receiving a data storage command for a plurality of memory cells in a given memory block in the configured memory;
dividing the data storage command into a plurality of operations, wherein each of the plurality of operations is performed on a respective subset of a plurality of subsets of the plurality of memory cells; and
staggering a start of each of the plurality of operations to begin at respective different times.

2. The method according to claim 1, further comprising dividing the plurality of memory cells into the plurality of subsets by setting a number of the plurality of subsets or a size of each subset of the plurality of subsets based on the specified peak power consumption.

3. The method according to claim 1, wherein the data storage command includes a read command, and further comprising dividing the plurality of memory cells into the plurality of subsets by defining each subset of the plurality of subsets to include memory cells of the plurality of memory cells that are associated with a respective group of bit lines of the memory.

4. The method according to claim 1, wherein the data storage command includes a write command to the plurality of memory cells that are associated with a given word line of the memory, and further comprising dividing the plurality of memory cells into the plurality of subsets by defining each subset of the plurality of subsets to include memory cells of the plurality of memory cells that are associated with a respective sub-portion of the given word line.

5. The method according to claim 1, wherein the data storage command includes an erasure command of the given memory block, and further comprising dividing the plurality of memory cells into the plurality of subsets by defining each of the plurality of subsets to include the memory cells associated with a respective group of word lines in the given memory block.

6. The method according to claim 1, wherein dividing the memory cells into the subsets staggering the start of each of the plurality of operations comprises setting a delay between the respective different times based on the specified peak power consumption.

7. The method according to claim 1, further comprising alternating an order in which the plurality of operations are applied to the plurality of subsets.

8. The method according to claim 1, wherein the plurality of memory cells are arranged in strings that include respective current sources, and wherein configuring the memory comprises controlling currents produced by the current sources based on the specified peak power consumption.

9. The method according to claim 1, wherein the plurality of memory cells are programmed using an iterative programming and verification (P&V) process, and wherein configuring the memory comprises adapting one or more parameters of the P&V process based on the specified peak power consumption.

10. The method according to claim 9, wherein adapting the parameters of the P&V process comprises iteratively increasing a verification threshold of the P&V process, without inhibiting the memory cells whose stored values have exceeded the verification threshold from receiving subsequent programming pulses.

11. An apparatus, comprising:
a memory including a plurality of memory blocks; and
circuitry, which is configured to:
    receive a command that specifies a peak power consumption that is not to be exceeded by the memory;
    configure the memory dependent upon the peak power consumption specified in the command;
    receive a data storage command for a plurality of memory cells in a given memory block of the plurality of memory blocks in the configured memory;
    divide the data storage command into a plurality of operations, wherein each of the plurality of operations is performed on a respective subset of a plurality of subsets of the plurality of memory cells; and
    stagger a start of each of the plurality of operations to begin at respective different times.

12. The apparatus according to claim 11, wherein the circuitry is configured to set a number of the plurality of subsets or a size of each subset of the plurality of subsets based on the specified peak power consumption.

13. The apparatus according to claim 11, wherein the data storage command includes a read command, and wherein the circuitry is further configured to define each subset of the plurality of subsets to include memory cells of the plurality of memory cells that are associated with a respective group of bit lines of the memory.

14. The apparatus according to claim 11, wherein the data storage command includes a write command to the plurality of memory cells that are associated with a given word line of the memory, and wherein the circuitry is further configured to define each subset of the plurality of subsets to include memory cells of the plurality of memory cells that are associated with a respective sub-portion of the given word line.

15. The apparatus according to claim 11, wherein the data storage command includes an erasure command of the given memory block, and wherein the circuitry is further configured to define each subset of the plurality of subsets to include memory cells of the plurality of memory cells that are associated with a respective group of word lines in the given memory block.

16. The apparatus according to claim 11, wherein the plurality of memory cells are arranged in strings that include respective current sources, and wherein the circuitry is further configured to control currents produced by the current sources based on the specified peak power consumption.

17. The apparatus according to claim 11, wherein the plurality of memory cells are programmed using an iterative programming and verification (P&V) process, and wherein the circuitry is further configured to adapt one or more parameters of the P&V process based on the specified peak power consumption.

18. An apparatus comprising:
a first interface, which is configured to communicate with a memory, wherein the memory includes a plurality of memory blocks;
a second interface, which is configured to communicate with a host processor; and
a memory processor, which is configured to:
    receive, via the second interface, a command that specifies a peak power consumption that is not to be exceeded by the memory;
    configure the memory dependent upon the peak power consumption specified in the command;
    receive a data storage command for a plurality of memory cells in a given memory block of the plurality of memory blocks in the configured memory;
    divide the data storage command into a plurality of operations, wherein each of the plurality of operations is performed on a respective subset of a plurality of subsets of the plurality of memory cells; and
    stagger a start of each of the plurality of operations to begin at respective different times.

19. The apparatus according to claim 18, wherein the plurality of memory cells are arranged in strings that include respective current sources, and wherein the memory processor is further configured to cause the memory to control currents produced by the current sources based on the specified peak power consumption.

20. The apparatus according to claim 18, wherein the plurality of memory cells are programmed using an iterative programming and verification (P&V) process, and wherein the memory processor is further configured to adapt one or more parameters of the P&V process based on the specified peak power consumption.

* * * * *